(12) United States Patent
Norimatsu et al.

(10) Patent No.: US 10,865,500 B2
(45) Date of Patent: Dec. 15, 2020

(54) SIC EPITAXIAL WAFER AND METHOD FOR MANUFACTURING SIC EPITAXIAL WAFER

(71) Applicant: SHOWA DENKO K.K., Tokyo (JP)

(72) Inventors: Jun Norimatsu, Yokohama (JP); Akira Miyasaka, Chichibu (JP); Yoshiaki Kageshima, Yokohama (JP); Koji Kamei, Chichibu (JP); Daisuke Muto, Kusatsu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 15/553,248

(22) PCT Filed: Feb. 16, 2016

(86) PCT No.: PCT/JP2016/054417
§ 371 (c)(1),
(2) Date: Aug. 24, 2017

(87) PCT Pub. No.: WO2016/140051
PCT Pub. Date: Sep. 9, 2016

(65) Prior Publication Data
US 2018/0016706 A1    Jan. 18, 2018

(30) Foreign Application Priority Data

Mar. 3, 2015    (JP) ................. 2015-041315

(51) Int. Cl.
*C30B 29/36* (2006.01)
*H01L 21/20* (2006.01)
*H01L 21/205* (2006.01)

(52) U.S. Cl.
CPC .............. *C30B 29/36* (2013.01); *H01L 21/20* (2013.01); *H01L 21/2003* (2013.01); *H01L 21/205* (2013.01); *H01L 21/2053* (2013.01)

(58) Field of Classification Search
CPC .. C30B 29/36; H01L 21/2003; H01L 21/2053
See application file for complete search history.

(56) References Cited

U.S. PATENT DOCUMENTS

| 2011/0278596 | A1  | 11/2011 | Aigo et al. |
| 2012/0146056 | A1* | 6/2012  | Momose ................. C30B 25/20 |
|              |     |         | 257/77 |

(Continued)

FOREIGN PATENT DOCUMENTS

| CN | 103649385 A | 3/2014 |
| EP | 2 755 228 A1 | 7/2014 |

(Continued)

OTHER PUBLICATIONS

Ishiyama et al, Gate oxide reliability on trapezoid-shaped defects and obtuse triangular defects in 4H—SiC epitaxial wafers, Japanese Journal of Applied Physics 53, 04EP15 (2014) (Year: 2014).*

(Continued)

*Primary Examiner* — Hua Qi
(74) *Attorney, Agent, or Firm* — Sughrue Mion, PLLC

(57) ABSTRACT

A SiC epitaxial wafer having a SiC epitaxial layer formed on a SiC single crystal substrate having an offset angle of 4 degrees or less in a<11-20>direction from a (0001) plane. A trapezoidal defect included in the SiC epitaxial wafer includes an inverted trapezoidal defect in which a length of a lower base on a downstream side of a step flow is equal to or less than a length of an upper base on an upstream side of the step flow. Also disclosed is a method for manufacturing the SiC epitaxial wafer.

4 Claims, 8 Drawing Sheets

31 MM FROM WAFER CENTER

θ=75°

28 MM FROM WAFER CENTER

θ=73°

WAFER CENTER

θ=52°

END PORTION                                                                                             CENTER

(56) References Cited

U.S. PATENT DOCUMENTS

| | | | |
|---|---|---|---|
| 2012/0280254 A1* | 11/2012 | Muto | C30B 25/186 257/77 |
| 2013/0217213 A1 | 8/2013 | Aigo et al. | |
| 2016/0168751 A1 | 6/2016 | Masumoto et al. | |

FOREIGN PATENT DOCUMENTS

| | | | |
|---|---|---|---|
| JP | 2005-277229 | A | 10/2005 |
| JP | 2006-273631 | A | 10/2006 |
| JP | 2009-256138 | A | 11/2009 |
| WO | 2010/087518 | A1 | 8/2010 |
| WO | 2012/067112 | A1 | 5/2012 |
| WO | 2014/156394 | A1 | 10/2014 |

OTHER PUBLICATIONS

Shrivastava et al, Journal of Crystal Growth, 310, 4443-4450, 2008 (Year: 2008).*

Ishiyama et al., "Gate oxide reliability on trapezoid-shaped defects and obtuse triangular defects in 4H—SiC epitaxial wafers," Japanese Journal of Applied Physics vol. 53, 04EP15, Mar. 25, 2014, pp. 04EP15-1-04EP15-4.

Sameshima et al., "Relation between defects on 4H—SiC epitaxial surface and gate oxide reliability," Materials Science Forum vols. 740-742, 2013, pp. 745-748.

Tamura et al., "Observation of defects similar to step-bunching in 4H—SiC Si-face substrates," Proceedings of 22nd Meeting on SiC and Related Semiconductors, 2013, 5 pgs.

Yamashita et al., "Origin Analyses of Trapezoid-Shape Defects in 4-deg.-off 4H—SiC Epiraxial Wafers by Synchrotron X-ray Topography," Materials Science Forum, vols. 778-780, 2014, pp. 374-377.

International Search Report for PCT/JP2016/054417, dated May 24, 2016 (PCT/ISA/210).

Communication dated Sep. 21, 2018, from the European Patent Office in counterpart European Application No. 16758745.0.

A. Shrivastava et al., "Study of triangular defects and inverted pyramids in 4H—SiC 4° off-cut (0001) Si face epilayers", Journal of Crystal Growth, Aug. 5, 2008, pp. 4443-4450, vol. 310, Elsevier B.V. (8 pages total).

Communication dated Nov. 21, 2018, from Korean Intellectual Property Office in corresponding Korean application No. 10-2017-7023073.

Communication dated Mar. 15, 2019, from the China National Intellectual Property Administration in corresponding Application No. 201680011723.9.

* cited by examiner

Step Flow

SIC EPITAXIAL WAFER AND METHOD FOR MANUFACTURING SIC EPITAXIAL WAFER

CROSS REFERENCE TO RELATED APPLICATIONS

This application is a National Stage of International Application No. PCT/JP2016/054417 filed Feb. 16, 2016, claiming priority based on Japanese Patent Application No. 2015-041315, filed Mar. 3, 2015, the contents of all of which are incorporated herein by reference in their entirety.

TECHNICAL FIELD

The present invention relates to a SiC epitaxial wafer and a method for manufacturing a SiC epitaxial wafer

BACKGROUND ART

Silicon carbide (SiC) has excellent physical properties to exhibit a band gap about three times wider, dielectric breakdown field strength about ten times stronger and thermal conductivity about three times greater, than those of silicon (Si). Therefore, the applications of SiC to a power device, a high frequency device, a high-temperature operation device or the like have been expected.

As a semiconductor device using a SiC epitaxial wafer, metal oxide semiconductor field effect transistors (MOSFETs) have been known. MOSFETs can be obtained by forming a gate oxide film on a SiC epitaxial layer by thermal oxidation or the like and forming a gate electrode on the gate oxide film. If the gate oxide film to be formed has a local thickness variation, current leakage occurs from a portion having a small thickness as a starting point. The current leakage is caused by partial destruction of the gate oxide film and is said to be an important degradation mode in MOSFETs. The local thickness variation in the gate oxide film is caused by defects present on the SiC epitaxial wafer. Surface irregularities known as step bunching are one of the causes for generating the local thickness variation in the gate oxide film.

High-quality SiC epitaxial wafers and the establishment of high-quality epitaxial growth techniques are required to promote the practical application of semiconductor devices using SiC epitaxial wafers.

However, the production of SiC single crystals requires high temperature growth at 2,000° C. or higher, and crystal defects are likely to occur. At this stage, it is impossible to realize perfect crystals with no crystal defects. A SiC single crystal substrate cut out from a bulk crystal of SiC has defects such as dislocations from the stage prior to the epitaxial growth. For this reason, it is inevitable that the SiC epitaxial wafer obtained by epitaxially growing a SiC layer on the SiC single crystal substrate also has some defects.

There are various defects in the SiC epitaxial wafer. Not all of these defects adversely affect the semiconductor device. Depending on the type of defects, there are those that have little or no adverse effect on the semiconductor device. It has been required to identify defects having a large influence on semiconductor devices among various types of defects, and to suppress the occurrence of these defects.

A trapezoidal defect is known as one of the defects having a large influence on semiconductor devices (for example, Non-Patent Documents 1 to 3). The trapezoidal defect is a defect formed during growth of the epitaxial layer starting from short step bunching (hereinafter referred to as "SSB") generated on the SiC single crystal substrate by performing an etching step before the epitaxial growth.

The trapezoidal defect has a line-shaped defect formed immediately above the SSB and a line-shaped defect formed on the downstream side of a step flow due to the SSB on the surface of the epitaxial layer. Each of the defects becomes an upper base and lower base of a trapezoid and forms a trapezoidal defect as a whole. It is generally called a trapezoidal defect because the appearance as seen from the epitaxial surface has a trapezoidal shape.

Step bunching is a huge step formed by rows of steps being coalesced into a bundle during crystal growth when steps are present on the substrate surface in a staircase-like manner. The step bunching is formed during crystal growth. In addition, the step bunching is also formed by the movement of surface atoms due to a heat treatment without growth. In the case of using a substrate whose crystal plane is slightly inclined with respect to the crystal growth plane, common step bunching has a macroscopic length extended in a direction substantially perpendicular to the direction of slight inclination, and is observed as surface roughness having a certain area. On the other hand, the short step bunching (SSB) referred to in the present specification is distinguished from those commonly observed having such a macroscopic length. The SSB is generated with minute defects such as dislocations as a starting point in which atomic steps (usually about 2 to 10 atomic layers) are gathered and coalesced on the surface to exist in isolation. The step difference itself on the surface may also be referred to as SSB. Typically, the SSB has a short and limited length of about several tens of micrometers to 1 mm or less, and occurs accompanying individual causal defects.

In general, an aggregate of atomic steps generated in a state where a SiC single crystal substrate is heat-treated is often called a short step bunching (SSB). Therefore, the term is also used in that sense in the present specification, and the step bunching generated on the surface after the epitaxial growth is distinguished by calling it a short step bunching (SSB on the surface of the epitaxial layer) on the surface of the epitaxial layer.

Various studies are under way in order to suppress trapezoidal defects. For example, Non-Patent Document 1 describes that when an oxide film is formed on the surface of an epitaxial wafer having a trapezoidal defect, the thickness of the oxide film formed on the lower base of the trapezoidal defect becomes nonuniform. A defect on the upper base side of the trapezoidal defect on the epitaxial layer surface (defect on the upstream side of the step flow, defect immediately above the SSB) has a length approximately equal to the length of the initial SSB, and it does not become such a large step difference as compared with the step difference of the initial SSB. Here, the expression "initial SSB" refers to an SSB generated immediately after starting to grow an epitaxial layer on a SiC single crystal substrate. On the other hand, a defect on the lower base side on the epitaxial layer surface (on the downstream side of the step flow) becomes a large step difference as compared with the step difference of the initial SSB. Therefore, while the thickness of the oxide film formed on the upper base is uniform, the thickness of the oxide film formed on the lower base varies. For this reason, a locally thin portion exists in the oxide film formed on the lower base, and leakage tends to occur in that portion. In other words, it has been described that the defect on the lower base side of the epitaxial layer surface greatly affects the semiconductor device.

Further, for example, Non-Patent Document 2 describes that a trapezoidal defect occurs due to basal plane dislocations, threading edge dislocations, threading screw dislocations, a dislocation loop caused by processing scratches or the like. It is also described that trapezoidal defects do not occur from all of these dislocations and the like but trapezoidal defects occur with probability depending on conditions.

Furthermore, Non-Patent Document 3 describes that the length of the SSB on the SiC single crystal substrate changes by changing the hydrogen etching conditions before the epitaxial growth.

A method of reducing the surface roughness of the epitaxial layer by performing etching before the epitaxial growth is also known, although its purpose is not necessarily to suppress the trapezoidal defects. For example, in Patent Document 1, in order to suppress the generation of Si droplets, a gas containing silicon and chlorine is used in addition to a hydrogen gas as an etching gas. In Patent Document 2, it is described that a hydrogen chloride gas is added to an etching gas.

CITATION LIST

Patent Documents

[Patent Document 1] International Publication No. WO 2012/067112
[Patent Document 2] International Publication No. WO 2010/087518

Non-Patent Documents

[Non-Patent Document 1] J. Sameshima et al., Materials Science Forum Vols. 740-742 (2013) pp. 745.
[Non-Patent Document 2] T. Yamashita et al., Materials Science Forum Vols. 778-780 (2014) pp. 374.
[Non-Patent Document 3] Tamura et al., Proceedings of 22nd Meeting on SiC and Related Semiconductors (p. 140)

SUMMARY OF INVENTION

Technical Problem

As described above, although the analysis of the trapezoidal defects themselves has been progressed, attempts to suppress the adverse effects on the semiconductor device due to the trapezoidal defects have not progressed sufficiently.

For example, Non-Patent Documents 1 and 2 only analyze the generation mechanism of trapezoidal defects, and do not describe a means for suppressing the adverse effects on the semiconductor device due to these trapezoidal defects.

Non-Patent Document 3 describes that the length of the SSB locally generated in a SiC single crystal substrate can be controlled. This leads to the control of the length of the upper base of the trapezoidal defect. However, it is the step difference at the lower base of the trapezoidal defect that exerts a large influence on the semiconductor device. Even if the upper base can be controlled, if the lower base cannot be controlled, the adverse effects on the semiconductor device cannot be sufficiently suppressed.

In Patent Documents 1 and 2, although the macroscopic roughness of the surface of the epitaxial layer has been mentioned, the more microscopic (local) SSB on the surface of the epitaxial layer has not attracted attention. In particular, there is neither description nor suggestion on improvement of the trapezoidal defects caused by the SSB locally generated immediately after the epitaxial growth.

The present invention has been made in view of the above problems, and has an object of obtaining a high-quality SiC epitaxial wafer that can be used for a MOSFET device or the like by controlling the shape of a trapezoidal defect that adversely affects a MOSFET device or the like.

Solution to Problem

As a result of intensive studies, the inventors of the present invention found that the shape of the trapezoidal defect can be controlled by growing the SiC epitaxial film under predetermined conditions, thereby completing the present invention. That is, the present invention provides the following means in order to solve the above problems.

(1) A SiC epitaxial wafer according to one aspect of the present invention is a SiC epitaxial wafer in which a SiC epitaxial layer is formed on a SiC single crystal substrate having an offset angle of 4 degrees or less in a<11-20>direction from a (0001) plane,
wherein a trapezoidal defect included in the aforementioned SiC epitaxial wafer includes an inverted trapezoidal defect in which a length of a lower base on a downstream side of a step flow is equal to or less than a length of an upper base on an upstream side of the step flow.

(2) In the SiC epitaxial wafer described in the above (1), a ratio of the aforementioned inverted trapezoidal defect in the aforementioned trapezoidal defect may be 50% or more.

(3) In the aforementioned inverted trapezoidal defect in the SiC epitaxial wafer described in any one of the above (1) or (2), there may be those having the length of the lower base on the downstream side of the step flow of 0 and a triangular shape.

(4) A method for manufacturing a SiC epitaxial wafer according to one aspect of the present invention is a method for manufacturing the SiC epitaxial wafer described in any one of the above (1) to (3), which includes
an etching step for etching a SiC single crystal substrate and
an epitaxial growth step for growing an epitaxial layer on the SiC single crystal substrate after etching,
wherein in the aforementioned epitaxial growth step, a concentration ratio C/Si of a Si-based source gas and a C-based source gas is equal to or less than 1.0.

(5) In the method for manufacturing a SiC epitaxial wafer described in the above (4), a temperature in the aforementioned epitaxial growth step may be 1,630° C. or lower.

(6) In the aforementioned etching step in the method for manufacturing a SiC epitaxial wafer described in any one of the above (4) or (5), an etching gas may be a silane ($SiH_4$) gas.

(7) In the method for manufacturing a SiC epitaxial wafer described in any one of the above (4) to (6), a temperature in the aforementioned etching step may be lower than a temperature in the aforementioned epitaxial growth step.

Advantageous Effects of Invention

A SiC epitaxial wafer according to one aspect of the present invention is a SiC epitaxial wafer having a SiC epitaxial layer formed on a SiC single crystal substrate having an offset angle of 4 degrees or less in the <11-20>direction from the (0001) plane, wherein a trapezoidal defect included in the aforementioned SiC epitaxial wafer includes an inverted trapezoidal defect in which the length of the lower base on the downstream side of the step flow is equal to or less than the length of the upper base on the upstream side of the step flow. The ratio of the inverted trapezoidal defects among the trapezoidal defects is preferably 50% or more.

The shape of the trapezoidal defect is controlled in the SiC epitaxial wafer according to one aspect of the present invention as compared with a conventional SiC epitaxial wafer. That is, by using this SiC epitaxial wafer, the adverse effects on the semiconductor device due to the trapezoidal defect can be suppressed.

In the inverted trapezoidal defects, there may be one in which the length of the lower base on the downstream side of the step flow is 0 and the shape is triangular. As described above, the step difference at the lower base of the trapezoidal defect has a large influence on the semiconductor device. According to this configuration, since the lower base does not exist, the adverse effects on the semiconductor device due to the trapezoidal defect can be further suppressed.

A method for manufacturing a SiC epitaxial wafer according to one aspect of the present invention is a method for manufacturing the SiC epitaxial wafer described above, which includes an etching step for etching a SiC single crystal substrate and an epitaxial growth step for growing an epitaxial layer on the SiC single crystal substrate after etching, wherein in the step for growing an epitaxial layer, a concentration ratio C/Si of a $SiH_4$ gas and a $C_3H_8$ gas is set to 1.0 or less. The temperature in the epitaxial growth step may be 1,630° C. or lower.

According to this configuration, it is possible to control the shape of the trapezoidal defect so that the length of the lower base side of the trapezoidal defect is shorter than the length of the upper base side. That is, it is possible to suppress the adverse effects on the semiconductor device due to the trapezoidal defect.

In the etching step, the etching gas may be a silane ($SiH_4$) gas. Furthermore, the temperature in the etching step may be lower than the temperature in the epitaxial growth step.

According to this configuration, it is possible to shorten the length of the SSB that determines the length of the upper base of the trapezoidal defect. Therefore, it is possible to relatively reduce the shape of the trapezoidal defect, and it is possible to further suppress the adverse effects on the semiconductor device due to the trapezoidal defect.

DESCRIPTION OF EMBODIMENTS

Figure 1:
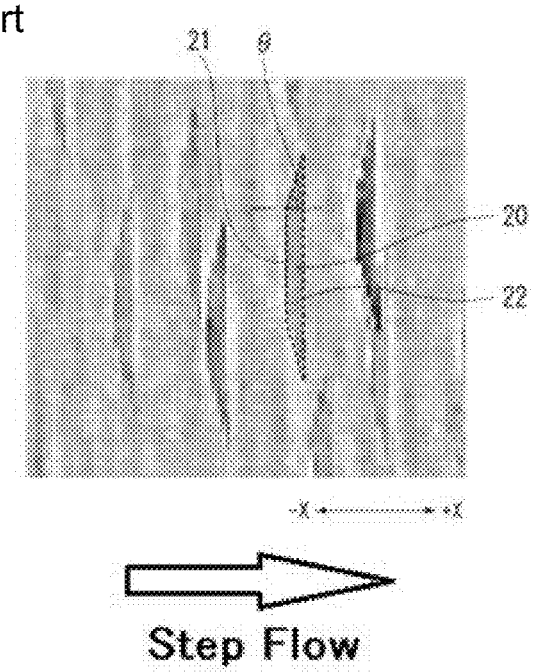
FIG. 1 is an image taken by an optical surface inspection device of a trapezoidal defect confirmed on a conventional SiC epitaxial wafer.

Hereinafter, a SiC epitaxial wafer and a method for manufacturing a SiC epitaxial wafer to which the present invention is applied will be described in detail with appropriate reference to the drawings. In the drawings used in the following description, for easy understanding of the features of the present invention, there are cases where characteristic portions are enlarged for the sake of convenience, and thus the dimensional ratio of each constituent element is sometimes different from the actual dimensional ratio. Materials, dimensions, and the like exemplified in the following description are merely examples, and the present invention is not limited thereto and can be carried out with appropriate modifications without departing from the gist thereof.

"Trapezoidal Defect"

Before describing the configuration of the present invention, trapezoidal defects will be described. FIG. 1 is an image taken by an optical surface inspection device of a trapezoidal defect confirmed on a conventional SiC epitaxial wafer. In FIG. 1, the periphery of one trapezoidal defect is surrounded by a dotted line so as to make it easy to distinguish the trapezoidal defect.

As shown in FIG. 1, a trapezoidal defect 20 in a conventional SiC epitaxial wafer has an upper base 21 formed by extending in a direction perpendicular to the offset direction that is, the direction perpendicular to the step flow growth direction on the upstream side (−X direction in the drawing) of the step flow in the offset direction, and a lower base 22 formed by extending in a direction perpendicular to the offset direction on the downstream side (+X direction in the drawing) of the step flow in the offset direction. At this time, the shape of the trapezoidal defect 20 is an isosceles trapezoid, and the length of the lower base 22 is longer than the length of the upper base 21. Therefore, with regard to an angle θ formed by a perpendicular line perpendicular to the upper base 21 and the lower base 22 with an oblique side of the trapezoidal defect 20, if an angle extending from the upper base 21 toward the lower base 22 is positive, a relationship of θ>0 is always satisfied.

In the present specification, since the step flow grows in a direction in which the offset angle of the substrate is given, the direction in which the offset angle of the substrate is given may be described as the offset direction or the step flow growth direction in some cases, although these mean the same direction. A direction in which the step flow grows is defined as downstream, and the direction thereof may be referred to as "offset downstream" and the opposite direction may be referred to as "offset upstream".

Figure 2:
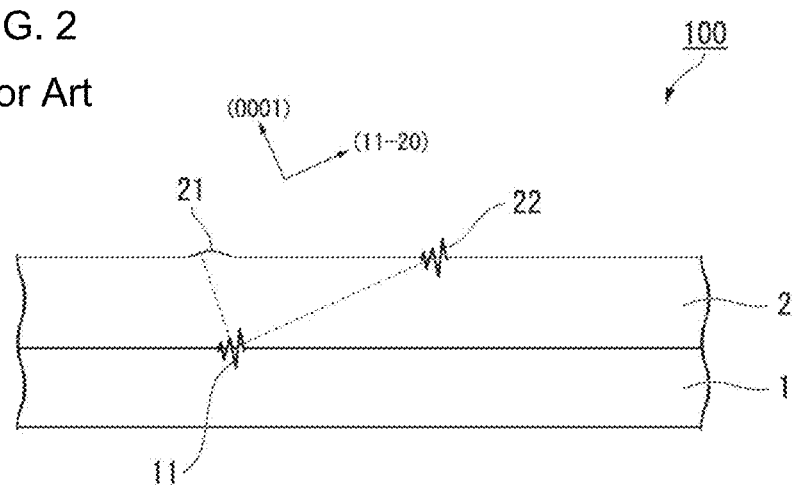
FIG. 2 is a schematic cross-sectional view of a trapezoidal defect confirmed on a conventional SiC epitaxial wafer.

FIG. 2 is a schematic cross-sectional view of a trapezoidal defect confirmed on a conventional SiC epitaxial wafer. A SiC epitaxial wafer 100 includes a SiC single crystal substrate 1 and a SiC epitaxial layer 2. The SiC epitaxial layer 2 performs step flow growth in a (11-20) direction from the SiC single crystal substrate 1. For this reason, when an SSB 11 is present on the SiC single crystal substrate 1, this step difference propagates while extending in the growth process. The propagated step difference is confirmed on the surface of the SiC epitaxial wafer 100 as the lower base 22 of the trapezoidal defect 20. That is, the lower base 22 of the trapezoidal defect 20 is a step difference formed by the propagated SSB 11 while extending in the length direction of the step flow growth direction in plan view as well as in the height direction in cross-sectional view, so as to become an SSB of the epitaxial layer surface.

On the other hand, a step difference also appears on the surface of the epitaxial layer 2 and at a position advanced from the SSB 11 in the (0001) direction. This step difference corresponds to the upper base 21 of the trapezoidal defect 20 formed on the surface of the SiC epitaxial wafer 100. Since the step difference of the upper base 21 does not greatly extend from the step difference of the SSB 11, it is relatively smaller than the step difference of the lower base 22 as a step difference. That is, with the SSB 11 as a starting point, defects are formed almost directly above thereof and on the offset downstream side as two sides, and the trapezoidal defect 20 is formed by connecting these two sides.

"Short Step Bunching (SSB)"

Next, the SSB 11 serving as the starting point of the trapezoidal defect 20 will be described. Although there are various reasons for forming the step bunching, an SSB generated by etching due to defects such as dislocations among them will be described with reference to FIG. 3.

Figure 3:
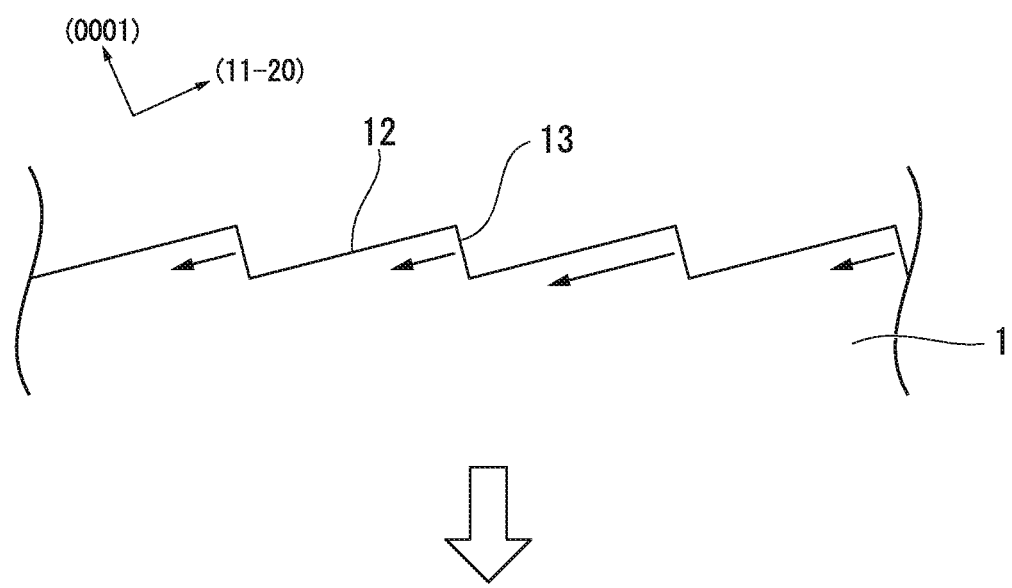
FIG. 3 is a schematic cross-sectional view schematically showing how the surface of an SiC single crystal substrate is etched.
Figure 3:
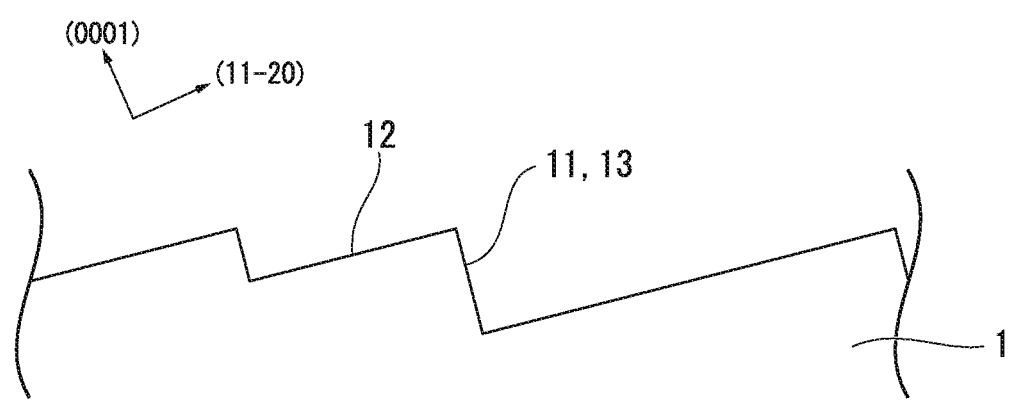

FIG. 3 is a schematic cross-sectional view obtained by enlarging the surface of the SiC single crystal substrate 1. The surface of the SiC single crystal substrate 1 has an offset angle and is slightly inclined from the (0001) plane. Therefore, an atomic level terrace 12 and a step 13 are combined to constitute the surface of the SiC single crystal substrate 1. When gas phase etching is applied to the SiC single crystal substrate 1, etching progresses sequentially from the end portion of the step 13, and ideally the surface shape is not affected. However, for example, if basal plane dislocations, threading edge dislocations, threading screw dislocations or a dislocation loop caused by processing scratches or the like is present on the surface, the etching rate increases at a portion of the defect exposed on the substrate surface. As a result, etching progresses in a direction perpendicular to the offset direction around that portion. After the etching is finished, there is a portion where the step difference of the step 13 is larger than the other parts with respect to the terrace 12. This large step difference is one aspect of the SSB 11. Therefore, the SSB 11 is formed in a line shape centered around the defect as the starting point in a (1-100) direction perpendicular to the offset direction. For this reason, the upper base 21 and the lower base 22 of the trapezoidal defect 20 formed along with the SSB 11 are also formed in the (1-100) direction perpendicular to the offset direction.

Based on the above-mentioned reasons why the trapezoidal defect 20 and the SSB 11 are formed, the SiC epitaxial wafer of the present invention will be described.

(SiC epitaxial wafer) A SiC epitaxial wafer according to one aspect of the present invention is a SiC epitaxial wafer in which a SiC epitaxial layer is formed on a SiC single crystal substrate having an offset angle of 4 degrees or less in the <11-20>direction from the (0001) plane. Trapezoidal defects are included in the SiC epitaxial wafer. Among the trapezoidal defects, an inverted trapezoidal defect is included in which the length of the lower base on the downstream side of the step flow is equal to or less than the length of the upper base on the upstream side of the step flow.

Although the SiC single crystal substrate has many polytypes, 4H-SiC is mainly used for fabricating a practical SiC device. The SiC device is fabricated on a SiC epitaxial wafer. The SiC epitaxial wafer is obtained by forming a SiC epitaxial layer to serve as an active region of the SiC device by a chemical vapor deposition (CVD) method on a SiC single crystal wafer processed from a bulk crystal fabricated by a sublimation method or the like. During formation of the epitaxial layer, polytypes different from the polytype used for the SiC single crystal substrate are likely to be mixed. For example, when 4H-SiC is used for the SiC single crystal substrate, 3C-SiC or 8H-SiC is mixed in the epitaxial layer. During epitaxial growth, it is common to perform step flow growth (lateral growth from an atomic step) in which the SiC single crystal substrate is slightly tilted (tilted by an offset angle) in order to suppress mixing of these polytypes.

Figure 4:
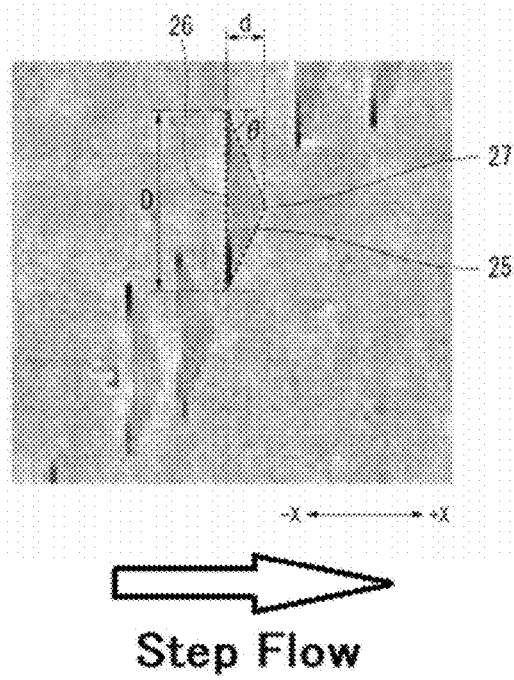
FIG. 4 is an image taken by an optical surface inspection device of an inverted trapezoidal defect confirmed on the SiC epitaxial wafer of the present invention.

FIG. 4 is an image by an optical surface inspection device of an inverted trapezoidal defect 25 confirmed on a SiC epitaxial wafer according to one aspect of the present invention. In FIG. 4, the −X direction is the offset upstream direction and the +X direction is the offset downstream direction. As shown in FIG. 4, the SiC epitaxial wafer according to one aspect of the present invention has an inverted trapezoidal defect 25 in which the length of a lower base 27 is equal to or less than the length of an upper base 26. In the conventional trapezoidal defect 20 shown in FIG. 1, the length of the upper base 21 is shorter than the length of the lower base 22. The inverted trapezoidal defect 25 is different from the conventional trapezoidal defect 20 in the relationship between the lengths of the upper base and the lower base. For this reason, in the inverted trapezoidal defect 25 in FIG. 4, with regard to an angle θ formed by a perpendicular line perpendicular to the upper base 26 and the lower base 27 with an oblique side of the trapezoidal defect 25, if an angle extending from the upper base 21 toward the lower base 22 in FIG. 1 is positive, a relationship of 0<0 is always satisfied.

As described above, it is the step difference of the lower bases 22 and 27 of the trapezoidal defects that greatly affects the semiconductor device. The inverted trapezoidal defect 25 has a shorter length of the lower base 27 as compared with the conventional trapezoidal defect 20. That is, the inverted trapezoidal defect 25 can be said to be a defect having less adverse effects on the semiconductor device as compared with the conventional trapezoidal defect 20. In other words, in the SiC epitaxial wafer according to one aspect of the present invention, a portion of the trapezoidal defects is the inverted trapezoidal defect 25, and it is possible to suppress the adverse effects on the semiconductor device. More specifically, by using the SiC epitaxial wafer according to one aspect of the present invention, it is possible to suppress withstand voltage abnormality of the MOS capacitor, the occurrence of leakage current and the like.

The ratio of the inverted trapezoidal defects 25 among the trapezoidal defects present in the SiC epitaxial wafer is preferably 50% or more, and more preferably 75% or more. As the ratio of the inverted trapezoidal defects increases, the adverse effects on the semiconductor device can be suppressed. It has been confirmed that not all the shapes of the trapezoidal defects are the same in the plane of the SiC epitaxial wafer, and the length of the lower base becomes shorter as it gets closer to the center of the SiC epitaxial wafer. That is, even when the SiC epitaxial wafer is formed under the same conditions, there are cases where defects are inverted trapezoidal defects 25 in the central portion and become normal trapezoidal defects 20 as it approaches the end portion of the SiC epitaxial wafer. Therefore, when the ratio of the inverted trapezoidal defects 25 among the trapezoidal defects present in the SiC epitaxial wafer is a predetermined ratio, it means that a portion within this predetermined ratio from the center of the SiC epitaxial wafer can be suitably used for semiconductor devices.

If the ratio of the inverted trapezoidal defects 25 among the trapezoidal defects is 50% or more, the semiconductor device can be manufactured from the SiC epitaxial wafer with high yield.

In the inverted trapezoidal defect 25, the length of the lower base 27 is preferably zero. That is, the inverted trapezoidal defect 25 preferably has a triangular shape. If the lower base 27 does not exist, it is possible to further suppress the adverse effects on the semiconductor device due to the trapezoidal defect.

A specific configuration for making the length of the lower base 27 in the inverted trapezoidal defect 25 zero will be described. The distance between the upper base 26 and the lower base 27 of the trapezoidal defect is defined as d, and the length of the upper base 26 is defined as D. At this time, the length of the lower base 27 is expressed by the formula: $D+2d \tan \theta$ ($\theta<0$). That is, in the case where $D+2d \tan \theta<0$, the length of the lower base 27 of the inverted trapezoidal defect 25 becomes 0 and the shape becomes triangular. When the offset angle is constant, the condition in the case where the inverted trapezoidal defect 25 has a triangular shape is determined by the thickness h of the epitaxial layer 2. If the offset angle is defined as $\varphi$, a relationship of $\tan \varphi = h/d$ is satisfied. Therefore, by setting the thickness h of the epitaxial layer 2 so as to satisfy the relationship of $D+2h \tan \theta/\tan \varphi<0$, it is possible to make the shape of the inverted trapezoidal defect 25 triangular.

The length of the SSB 11 in the SiC single crystal substrate is preferably 300 μm or less. The length of the SSB 11 in the SiC single crystal substrate corresponds to the length of the upper base on the upstream side of the step flow. In that sense, the length of the upper base on the upstream side of the step flow is preferably 300 μm or less. If the length of the SSB 11 is 300 μm or less, even if the thickness of the epitaxial layer 2 is thin, the length of the lower base 27 can be sufficiently shortened. That is, there is no need to make the epitaxial layer 2 thicker than necessary, and it is possible to obtain a high-quality SiC epitaxial wafer that can be efficiently used for a semiconductor device.

On the other hand, even if the length of the SSB 11 is of a certain length or more, by forming the epitaxial layer under predetermined conditions, the length of the lower base 27 can be freely controlled. Since the length of the SSB 11 in the SiC single crystal substrate corresponds to the length of the upper base on the upstream side of the step flow, even if the upper base on the upstream side of the step flow is of a certain length or more, it can also be said that the length of the lower base can be freely controlled by forming the epitaxial layer under predetermined conditions. For example, even if the length of the SSB 11 is 300 μm or more, by making the length of the lower base 27 on the surface of the epitaxial layer equal to or less than the length of the upper base 26, the adverse effects on the device can be reduced. That is, even if the length of the SSB 11 is 300 μm or more, the occurrence of device failure can be suppressed. In contrast, in a conventional SiC epitaxial wafer, the length of the lower base is longer than that of the upper base of the trapezoidal defect. Therefore, when the length of the SSB 11 is 300 μm or more, the length of the lower base of the trapezoidal defect becomes 300 μm or more to adversely affect the device greatly. That is, although the length of the SSB 11 is 300 μm or more, in other words, despite the fact that the length of the upper base on the upstream of the step flow is 300 μm or more, a SiC epitaxial wafer that can be suitably used for the device became feasible for the first time in the present invention.

The length of the SSB 11 changes under the influence of gas phase etching. On the other hand, since the conditions of gas phase etching also affect defects other than trapezoidal defects, they are determined in consideration of factors other than trapezoidal defects. In the past, it was necessary to select the conditions of gas phase etching, among the conditions for making the length of the upper base (the length of the SSB) not more than a certain value, whereas in the method for manufacturing a SiC epitaxial wafer according to one aspect of the present invention, it is possible to adopt a condition for making the SSB 11 to have a certain length or more as the gas phase etching condition. That is, both the suppression of trapezoidal defects and the suppression of other defects can be achieved.

As described above, the SiC epitaxial wafer according to one aspect of the present invention is suitably used when manufacturing a semiconductor device such as a MOSFET. In the SiC epitaxial wafer according to one aspect of the present invention, since the lower base 27 having a large step difference is small, there are few locally thin portions in the oxide film laminated thereon. Therefore, an oxide film having a uniform thickness can be formed. That is, it is possible to realize a MOSFET device in which problems such as withstand voltage abnormality of the MOS capacitor and the occurrence of leak current are suppressed.

(Manufacturing method of SiC epitaxial wafer) A method for manufacturing a SiC epitaxial wafer according to one aspect of the present invention will be described.

A method for manufacturing a SiC epitaxial wafer according to one aspect of the present invention is a method for manufacturing the SiC epitaxial wafer as described above, which includes an etching step for etching a SiC single crystal substrate and an epitaxial growth step for growing an epitaxial layer on the SiC single crystal substrate after etching. Further, in the step for growing the epitaxial layer, a concentration ratio C/Si of a Si-based source gas and a C-based source gas is set to 1.0 or less.

As a result of intensive studies by the present inventors, it was found that the length of the lower base of the trapezoidal defect can be controlled by controlling the C/Si ratio. By setting the C/Si ratio to 1.0 or less, among the trapezoidal defects included in the SiC epitaxial wafer, an inverted trapezoidal defect occurs in which the length of the lower base on the downstream side of the step flow is equal to or less than the length of the upper base on the upstream side of the step flow. When the C/Si ratio is reduced, the proportion of inverted trapezoidal defects among trapezoidal defects can be increased. On the other hand, if the C/Si ratio is made too small, it results in a carbon-rich SiC epitaxial layer. In reality, it is preferable to set the C/Si ratio to 0.8 or more and 1.0 or less.

It is also possible to control the length of the lower base of the trapezoidal defect by controlling the temperature in the epitaxial growth step. When lowering the temperature during epitaxial growth, the length of the lower base of the trapezoidal defect becomes short. More specifically, it is preferable to set the temperature in the epitaxial growth step to 1,630° C. or lower. If the temperature in the epitaxial growth step is too low, decomposition of the source gas does not occur adequately. Therefore, the temperature in the epitaxial growth step is preferably in the range of 1,600° C. to 1,630° C.

It is preferable not only to control the lower base of the trapezoidal defect but also to control the upper base and to control the shape of the trapezoidal defect as a whole. As described above, since the upper base directly reflects the length of the SSB formed on the SiC single crystal substrate, by controlling the length of the SSB on the surface of the SiC single crystal substrate, the length of the upper base of the trapezoidal defect can be controlled.

As the etching gas, a hydrogen gas, a hydrogen chloride gas, a silane ($SiH_4$) gas or the like can be used, although it is preferable to use a silane gas. Since the silane gas is not highly etchable as compared with the hydrogen gas or the like, it is possible to suppress the occurrence of SSB due to rapid etching. Further, these gases can be mixed and used.

The temperature in the etching step is preferably lower than the temperature in the epitaxial growth step. By lowering the temperature of the etching gas, the length of the SSB to be formed can be shortened. That is, the length of the upper base of the trapezoidal defect formed after the epitaxial growth can be shortened. Conventionally, when a silane gas is used as an etching gas, since there is a high possibility that a silicon droplet is generated, reduction of the temperature during etching to be lower than the temperature in the epitaxial growth step has been avoided. However, as a result of intensive studies, the inventors of the present invention have found that by setting the etching temperature from 1,500 to 1,550° C., it is possible to sufficiently shorten the length of SSB while suppressing the generation of silicon droplets.

The etching step can be independently set in advance by using the amount of reduction (number) of other defects as an indicator. Furthermore, by measuring the in-plane distribution of the trapezoidal defects in advance and adjusting the epitaxial growth conditions and the structure of the member of the growth device, it is possible to adjust so that the ratio occupied by the trapezoidal defects in the plane is reduced.

The length of the upper base is predicted under the etching conditions set independently, and based on the distribution of the shape of the trapezoidal defects measured and perceived in advance and the required thickness of the grown film, epitaxial growth conditions for making the length of the lower base of the trapezoidal defects to become a predetermined length or less are set. As a result, for example, the ratio of the inverted trapezoidal defects among the trapezoidal defects 2 present in the SiC epitaxial wafer can be set to 50% or more, or 75% or more, and the total extension amount of the lower base of the trapezoidal defect which becomes a killer defect can be kept to a low level while reducing other defects at the same time.

Examples

Hereinafter, examples of the present invention will be described. The present invention is not limited only to the following examples.

"Effects Due to C/Si Ratio"

Example 1

As a SiC single crystal substrate, a 3-inch 4H-SiC single crystal substrate was prepared. The 4H-SiC single crystal substrate has an offset angle of 4 degrees in a<11-20>direction with respect to a (0001) Si plane. Here, a shift of about ±0.5° is allowed for the offset angle of 4 degrees.

Next, the prepared 3-inch 4H-SiC single crystal substrate was placed in a hot wall planetary, wafer rotation and revolution-type CVD apparatus, and the surface of the 4H-SiC single crystal substrate was subjected to gas etching using a hydrogen gas. The etching temperature was 1,630° C. which was the same as the epitaxial growth temperature.

While supplying silane and propane as source gases and hydrogen as a carrier gas to the surface of the 4H-SiC single crystal substrate after etching, epitaxial growth was carried out under the conditions of a growth pressure of 15 kPa and a growth temperature of 1,630° C. until the thickness of the epitaxial layer reached 10 μm. At this time, the C/Si ratio was set to 0.95.

Figure 5:
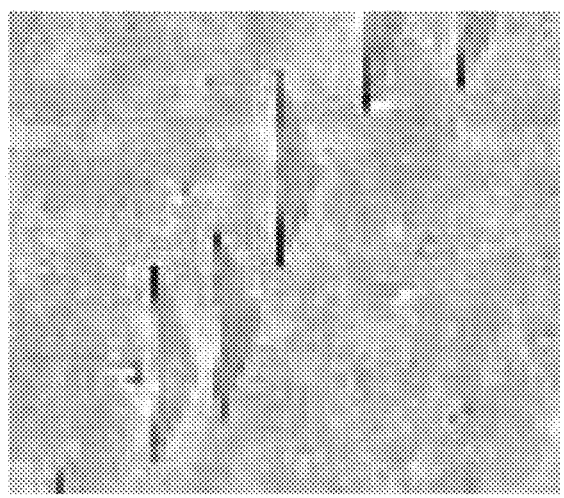
FIG. 5 is an image taken by an optical surface inspection device of a trapezoidal defect confirmed on an SiC epitaxial wafer of Example 1.

FIG. 5 is an image taken by an optical surface inspection device of a trapezoidal defect confirmed on the SiC epitaxial wafer of Example 1. As the optical surface inspection device, an optical surface analyzer Candela (Candela 6300 manufactured by KLA-Tencor Corporation) was used. The left side in the figure indicates the offset upstream. This image can also be confirmed using, other than the optical surface analyzer Candela, a surface inspection device SICA (manufactured by Lasertec Corporation) based on confocal and differential interference optical systems (not shown).

An angle θ formed by a perpendicular line perpendicular to the upper base and the lower base with an oblique side of the trapezoidal defect was θ=−62° when an angle extending from the upper base toward the lower base was positive.

The angle θ was obtained as an average value of 10 arbitrary trapezoidal defects present at a position of 28 mm from the center of the SiC epitaxial wafer. Because the wafer rotation and revolution-type apparatus was used, the distribution was almost a circular symmetric distribution in which the angle θ of the trapezoidal defects inside the position at 28 mm was smaller than −62° (angle at which the lower base became shorter). At this time, 90% or more of the trapezoidal defects present in the SiC epitaxial wafer had an inverted trapezoidal shape.

Example 2

An SiC epitaxial wafer was produced under the same conditions as in Example 1, except that the C/Si ratio was set to 1.00. An angle θ formed by a perpendicular line perpendicular to the upper base and the lower base with an oblique side of the trapezoidal defect was θ=0° when an angle extending from the upper base toward the lower base was positive.

Comparative Example 1

Figure 6:
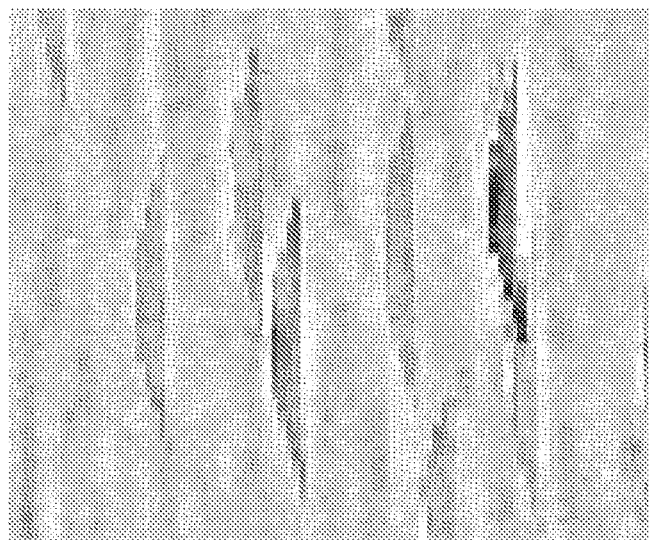
FIG. 6 is an image taken by an optical surface inspection device of a trapezoidal defect confirmed on an SiC epitaxial wafer of Comparative Example 1.

An SiC epitaxial wafer was produced under the same conditions as in Example 1, except that the C/Si ratio was set to 1.05. FIG. 6 is an image taken by an optical surface inspection device of a trapezoidal defect confirmed on the SiC epitaxial wafer of Comparative Example 1. The left side in the figure indicates the offset upstream. An angle θ formed by a perpendicular line perpendicular to the upper base and the lower base with an oblique side of the trapezoidal defect was θ=75° when an angle extending from the upper base toward the lower base was positive.

Figure 7:
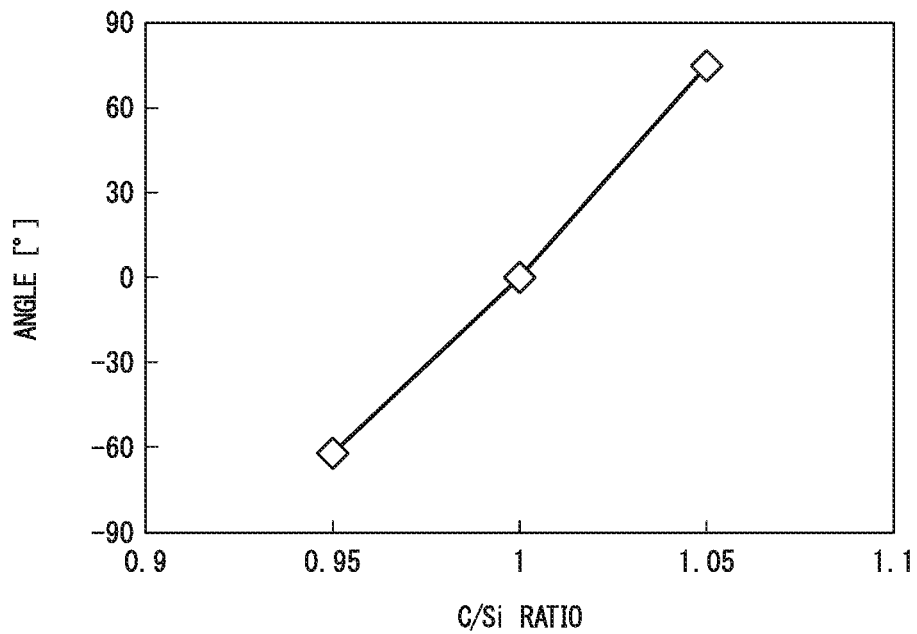
FIG. 7 shows a relationship between the C/Si ratios of Examples 1 and 2 and Comparative Example 1, and an angle θ formed by a perpendicular line perpendicular to the upper base and the lower base with an oblique side of the trapezoidal defect.

FIG. 7 shows a relationship of an angle θ formed by a perpendicular line perpendicular to the upper base and the lower base with an oblique side of the trapezoidal defect with respect to the C/Si ratios of Examples 1 and 2 and Comparative Example 1. If θ<0, the length of the lower base on the downstream side of the step flow is equal to or less than the length of the upper base on the upstream side of the step flow. If the C/Si ratio is 1.0 or less, a portion of the trapezoidal defects can be obtained as inverted trapezoidal defects.

"Effects Due to Epitaxial Growth Temperature"

Reference Example 1

A SiC epitaxial wafer was produced under the same conditions as in Comparative Example 1, except that the growth temperature was set to 1,650° C. As a result, an angle θ formed by a perpendicular line perpendicular to the upper base and the lower base with an oblique side of the trapezoidal defect was θ=80° when an angle extending from the upper base toward the lower base was positive.

Reference Example 2

A SiC epitaxial wafer was produced under the same conditions as in Comparative Example 1, except that the growth temperature was set to 1,610° C. As a result, an angle θ formed by a perpendicular line perpendicular to the upper base and the lower base with an oblique side of the trapezoidal defect was θ=66° when an angle extending from the upper base toward the lower base was positive.

Figure 8:
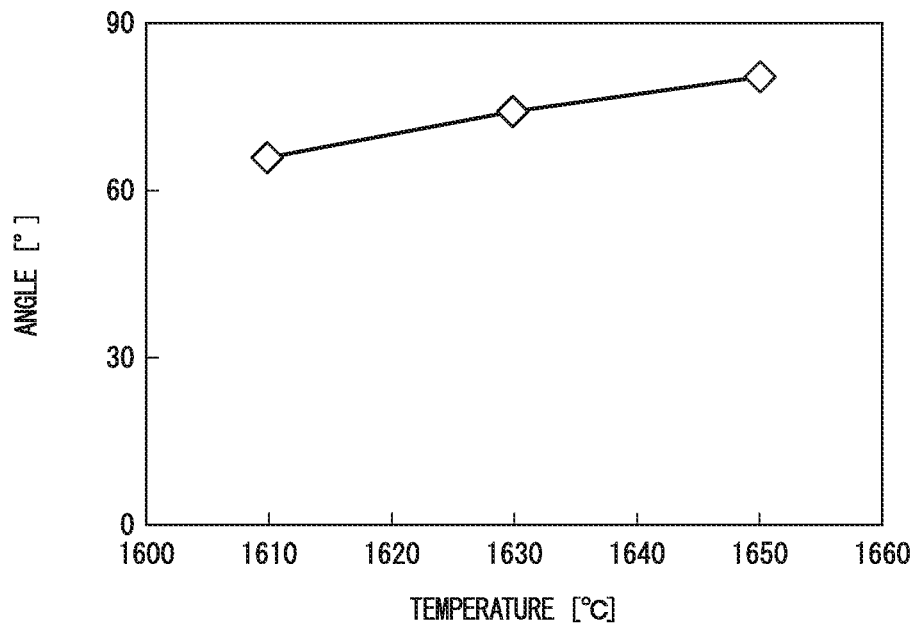
FIG. 8 shows a relationship between the epitaxial growth temperatures of Comparative Example 1 and Reference Examples 1 and 2, and an angle θ formed by a perpendicular line perpendicular to the upper base and the lower base with an oblique side of the trapezoidal defect.

FIG. 8 shows a relationship of an angle θ formed by a perpendicular line perpendicular to the upper base and the lower base with an oblique side of the trapezoidal defect with respect to the epitaxial growth temperatures of Comparative Example 1 and Reference Examples 1 and 2. As shown in FIG. 8, the angle θ decreases as the temperature decreases. That is, by lowering the temperature conditions during epitaxial growth in Example 1 and Example 2, an inverted trapezoidal defect with a lower base having a shorter length can be obtained.

"Effects Due to Epitaxial Growth Rate"

Reference Example 3

A SiC epitaxial wafer was produced under the same conditions as in Reference Example 1, except that the growth rate of the epitaxial layer was 1.5 times as high as that of Reference Example 1. An angle θ formed by a perpendicular line perpendicular to the upper base and the lower base with an oblique side of the trapezoidal defect was θ=87° when an angle extending from the upper base toward the lower base was positive.

Reference Example 4

Figure 9:
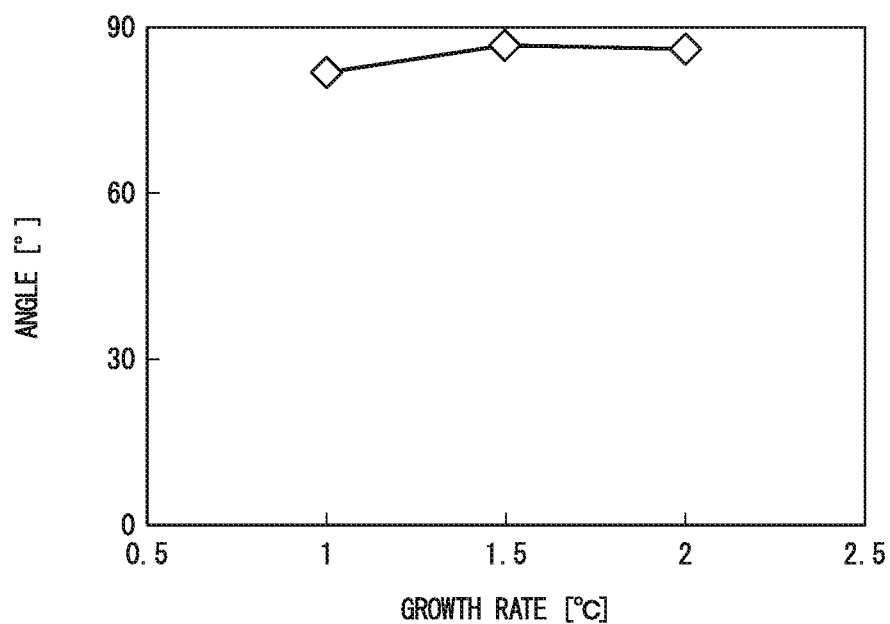
FIG. 9 shows a relationship between the epitaxial growth rates of Reference Examples 1, 3 and 4 and an angle θ formed by a perpendicular line perpendicular to the upper base and the lower base with an oblique side of the trapezoidal defect.

A SiC epitaxial wafer was produced under the same conditions as in Reference Example 1, except that the growth rate of the epitaxial layer was twice as high as that of Reference Example 1. An angle θ formed by a perpendicular line perpendicular to the upper base and the lower base with an oblique side of the trapezoidal defect was θ=86° when an angle extending from the upper base toward the lower base was positive. FIG. 9 shows a relationship of an angle θ formed by a perpendicular line perpendicular to the upper base and the lower base with an oblique side of the trapezoidal defect with respect to the epitaxial growth rates of Reference Examples 1, 3 and 4. As shown in FIG. 9, the shape of the trapezoidal defect does not depend on the epitaxial growth rate.

"Effects due to etching temperature"

Example 3

Figure 10:
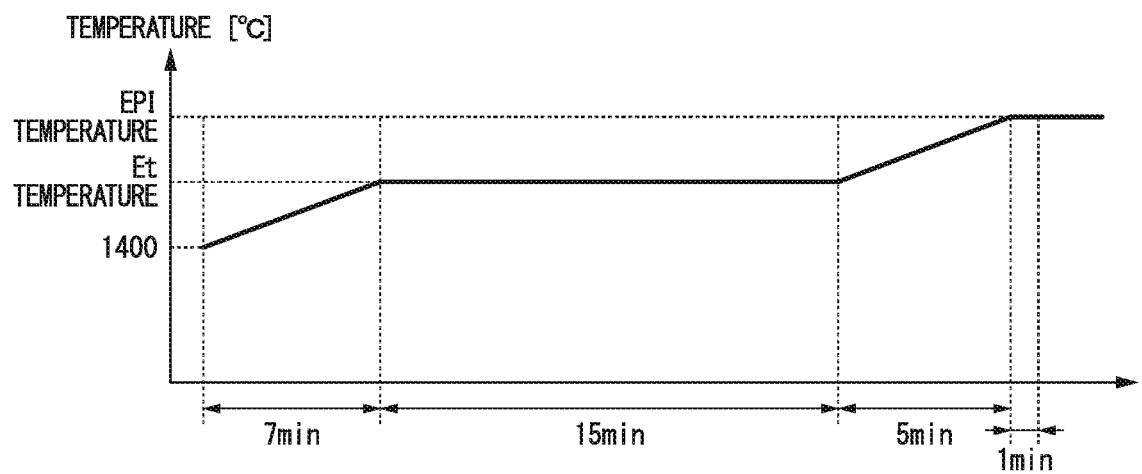
FIG. 10 schematically shows temperature rise conditions of a CVD apparatus in Examples 3 and 4.

An SiC epitaxial wafer was produced under the same conditions as in Example 1, except that the etching temperature was set to 1,550° C. FIG. 10 schematically shows temperature rise conditions of the CVD apparatus in Example 3 and Example 4 to be described later. As shown in FIG. 10, after raising the temperature to the etching temperature, etching was performed while maintaining the temperature for 15 minutes from the point of reaching the predetermined etching temperature (Et temperature in FIG. 10). Thereafter, the temperature was raised to a predetermined epitaxial growth temperature (epi temperature) over the course of 5 minutes, and epitaxial growth was performed after holding the temperature for 1 minute.

Example 4

Figure 11:
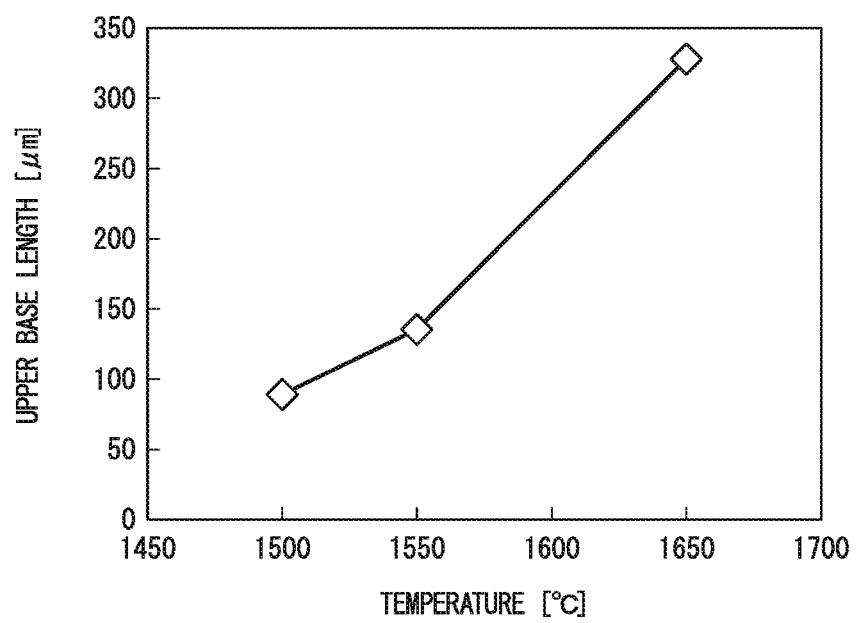
FIG. 11 is a graph showing the length of the upper base of the trapezoidal defect on the surface of the epitaxial layer with respect to the etching temperature.

A SiC epitaxial wafer was produced under the same conditions as in Example 3, except that the etching temperature was set to 1,500° C. FIG. 11 is a graph showing the length of the upper base of the trapezoidal defect on the surface of the epitaxial layer with respect to the etching temperature. The length of the upper base of the trapezoidal defect was obtained as an average value from 10 arbitrary points measured using the above-mentioned SICA analyzer. The length of the upper base of the trapezoidal defect in Example 1 was 328 μm, the length of the upper base of the trapezoidal defect in Example 3 was 135 μm and the length of the upper base of the trapezoidal defect in Example 4 was 90 μm. The lower the etching temperature, the shorter the length of the upper base of the trapezoidal defect could be made.

Further, the surface of the substrate taken out by only etching the substrate at the same etching temperature without performing epitaxial growth was measured separately in the same manner using the SICA analyzer and compared, and it was also confirmed that the length of the upper base of the trapezoidal defect on the surface after the epitaxial growth was almost the same as the length of the SSB before the epitaxial growth which was only subjected to etching.

"Effects due to in-plane position of SiC epitaxial wafer"

Figure 12:
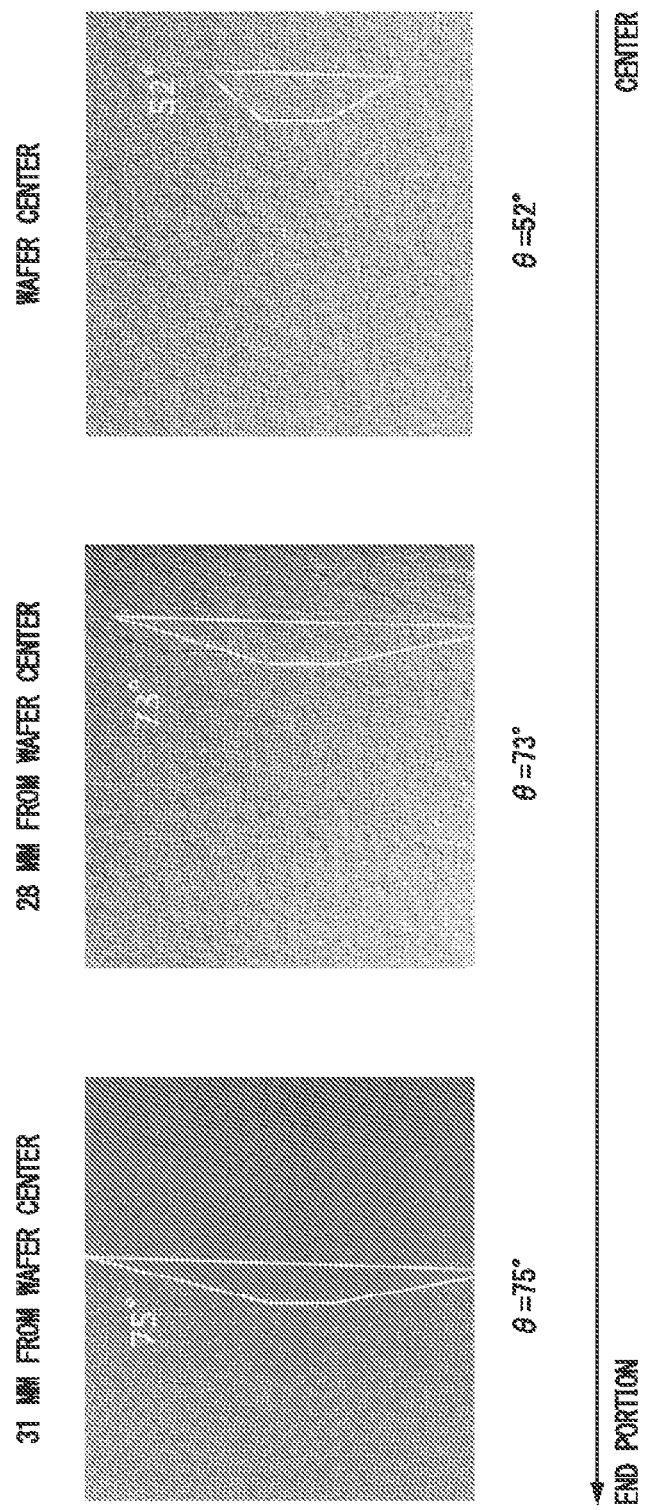
FIG. 12 is an image taken by an SICA analyzer of a trapezoidal defect confirmed for each measurement position of the SiC epitaxial wafer.

Using the SiC wafer of Comparative Example 1, the shape of the trapezoidal defect associated with the measurement positions of the SiC epitaxial wafer was confirmed. FIG. 12 is an image taken by the SICA analyzer of a trapezoidal defect confirmed for each measurement position of the SiC epitaxial wafer. From the right side in the figure, images were obtained by measuring at the center of the SiC epitaxial wafer, the position at 28 mm from the center of the SiC epitaxial wafer and the position at 31 mm from the center of the SiC epitaxial wafer, respectively. As shown in FIG. 12, as it gets closer to the end portion of the SiC epitaxial wafer, the length of the lower base becomes longer. This is thought to be due to a slight variation in the C/Si ratio even in the SiC epitaxial wafer plane.

REFERENCE SIGNS LIST

1: SiC single crystal substrate; 11: Short step bunching (SSB); 12: Terrace; 13: Step; 2: SiC epitaxial layer; 20:

Trapezoidal defect; 21: Upper base; 22: Lower base; 25: Inverted trapezoidal defect; 26: Upper base; 27: Lower base; 100: SiC epitaxial wafer.

The invention claimed is:

1. A SiC epitaxial wafer comprising a SiC epitaxial layer formed on a SiC single crystal substrate having an offset angle of 4 degrees or less in a<11-20>direction from a (0001) plane,
   wherein a trapezoidal defect included in the SiC epitaxial wafer comprises an inverted trapezoidal defect in which a length of a lower base on a downstream side of a step flow is equal to or less than a length of an upper base on an upstream side of the step flow,
   wherein the trapezoidal defect is on the surface of the epitaxial layer and the upper base of the trapezoidal defect is a lined shape.

2. The SiC epitaxial wafer according to claim 1, wherein a ratio of the inverted trapezoidal defect in the trapezoidal defect is 50% or more.

3. The SiC epitaxial wafer according to claim 1, wherein the length of the lower base on the downstream side of the step flow of the inverted trapezoidal defect is 0 and the inverted trapezoidal defect becomes a triangular shape.

4. A SiC epitaxial wafer comprising a SiC epitaxial layer formed on a SiC single crystal substrate having an offset angle of 4 degrees or less in a<11-20>direction from a (0001) plane,
   wherein a trapezoidal defect included in the SiC epitaxial wafer comprises an inverted trapezoidal defect in which a length of a lower base on a downstream side of a step flow is equal to or less than a length of an upper base on an upstream side of the step flow,
   wherein the trapezoidal defect is on the surface of the epitaxial layer and the upper base of the trapezoidal defect is a lined shape, and
   wherein a ratio of the inverted trapezoidal defect in the trapezoidal defect is 75% or more.

* * * * *